United States Patent [19]

Ryding

[11] 4,228,358
[45] Oct. 14, 1980

[54] WAFER LOADING APPARATUS FOR BEAM TREATMENT

[75] Inventor: Geoffrey Ryding, Manchester, Mass.

[73] Assignee: Nova Associates, Inc., Beverly, Mass.

[21] Appl. No.: 41,807

[22] Filed: May 23, 1979

[51] Int. Cl.² .......................... A61K 27/02; H01J 9/38
[52] U.S. Cl. ................................... 250/457; 250/309; 250/492 B
[58] Field of Search ................... 250/492 B, 309, 457, 250/440 T, 489

[56] References Cited

PUBLICATIONS

PR-200 Ion Implantation System by Bird et al., J. Vac. Sci. Technol. 15(3), May Jun. 1978, pp. 1080–1085.

Primary Examiner—Harold A. Dixon

[57] ABSTRACT

Ion implantation equipment of the spinning disk type has an automated disk exchange system employing a pair of arms that interchange disks between a pair of exchange stations. One exchange station is defined by a back cover of a target chamber that hinges down. The disk drive motor is mounted on that cover and introduces water cooling for the disk through the drive shaft. Heat conductive elastomeric material interposed between the disk and its support on the shaft ensures good heat transfer from the disk in a high vacuum environment. The exchange system employs linear and rotary actuators of the fluid cylinder type, and the pickup head employs a pneumatic robot that operates a toggle clamp that secures the disk for its scanning rotation.

20 Claims, 14 Drawing Figures

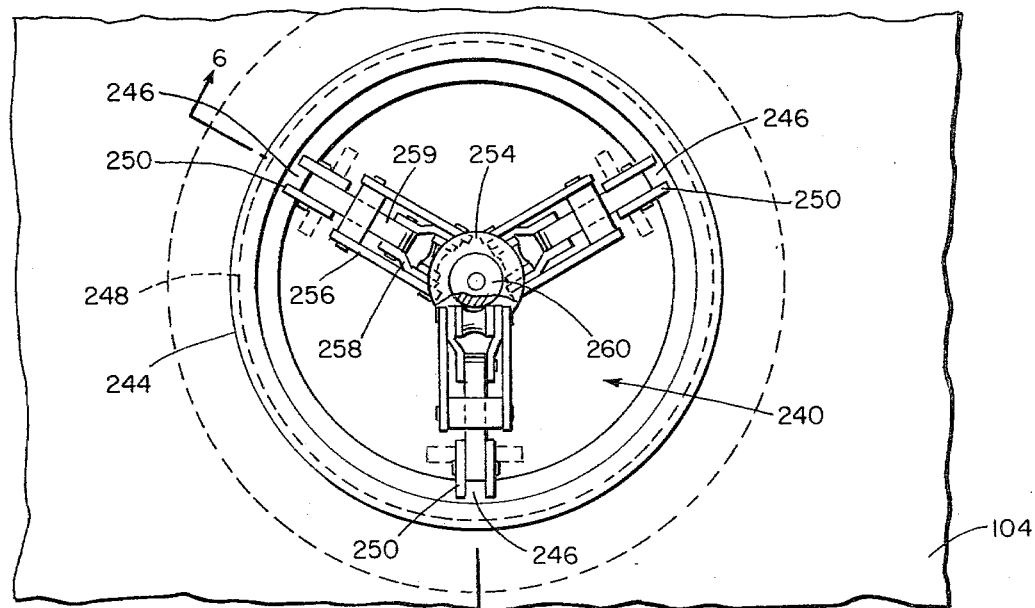
FIG. 5
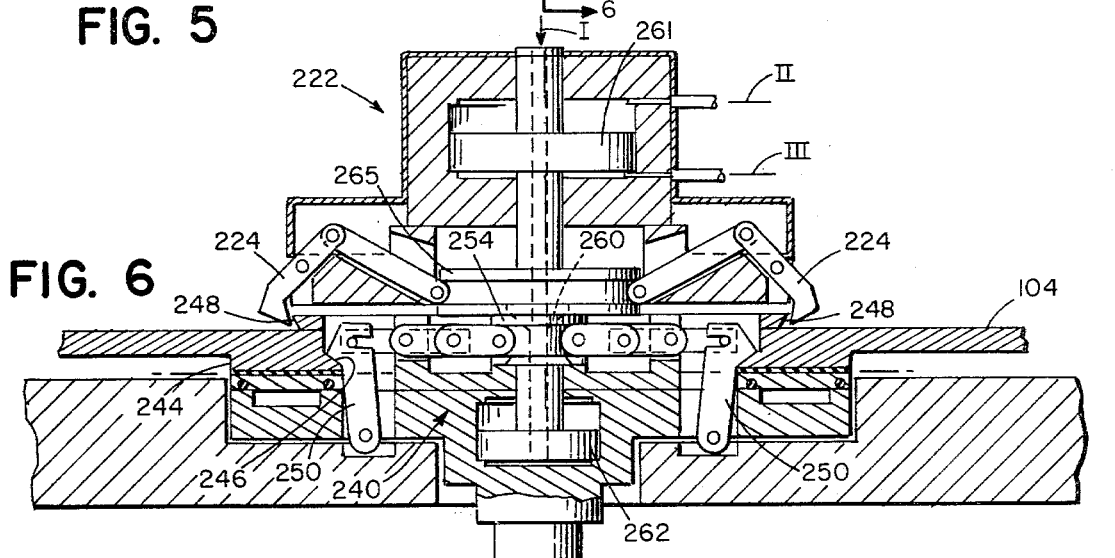
FIG. 6
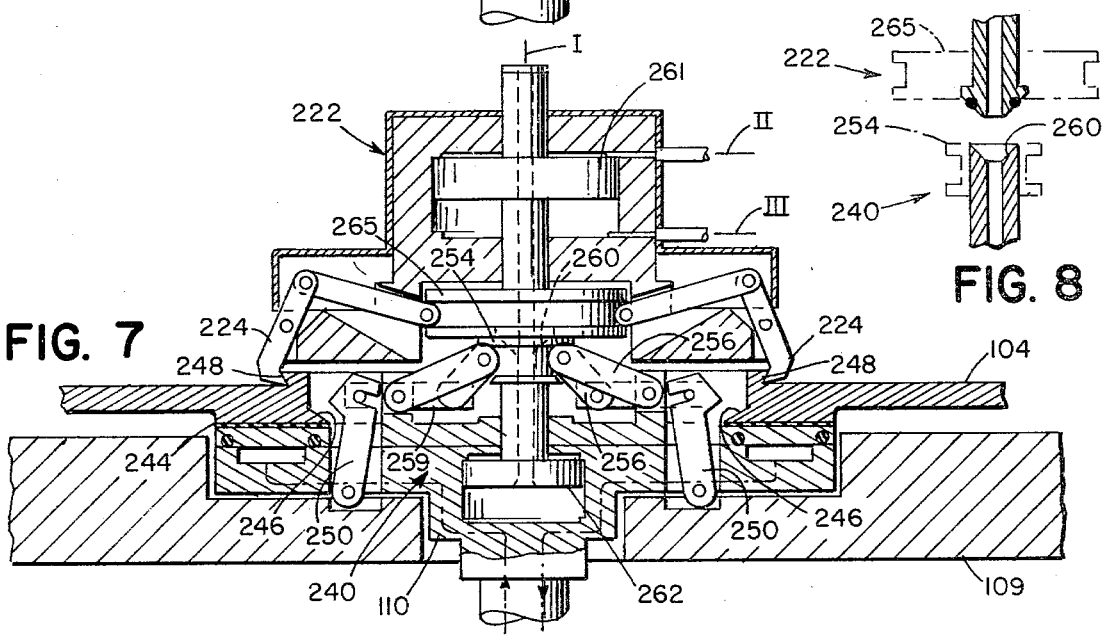
FIG. 7
FIG. 8

WAFER LOADING APPARATUS FOR BEAM TREATMENT

FIELD OF THE INVENTION

This invention relates to loading wafers onto support disks in ion implantation equipment.

BACKGROUND OF THE INVENTION

Ion implantation of semiconductor wafers is generally accomplished by supporting a plurality of semiconductor wafers on a disk (or other support element), mounting the disk inside a vacuum chamber, and directing an ion beam at the disk while it is moved with respect to the beam. After implantation is complete, new wafers are substituted. This is conventionally done by manually removing the disk from the chamber and substituting another disk loaded with the new wafers. The time required to perform the interchange subtracts from time available for implantation, thereby lowering the throughput of implanted wafers.

SUMMARY OF THE INVENTION

I have found that wafer throughput can be substantially increased and disk changeover simplified for the machine operator by providing means for moving a treated disk from the vacuum chamber to an exchange position adjacent a second exchange position where a new disk is placed. Once in the exchange position, a mechanism disengages a lock that attaches the disk to its driving spindle, reverses the positions of the two disks, and then locks the new disk to the spindle, leaving the new disk ready for movement to the vacuum chamber.

In preferred embodiments, the disk and spindle are attached to a hinged member that forms a wall of the vacuum chamber; a treated disk is moved to a first exchange position by rotating the hinged member 90° to bring the disk from a vertical position to a horizontal position; first and second pickup arms engage the centers of the disks to accomplish the transfer; two linear actuators move the arms vertically by different amounts into and out of contact with the disks at the exchange positions; two rotary actuators rotate the arms in horizontal planes between the first and second exchange positions; the rotary actuators are each equally spaced from the disk axes and so spaced from a line connecting the two disk axes that transfer of the disks between the exchange positions is accomplished by first linearly translating the disks through different distances, then rotating the arms to cause the disks to pass one over the other until they reach the other exchange position, then translating the disks back to the exchange positions; the disks are locked to the spindle by a locking assembly which includes a base connected to the spindle and, supported on the base, a plurality of locking arms and an overcenter mechanism for forcing the arms outward radially, the arms each having locking surfaces for engaging a tapered annular flange surface on the disks, whereby the disks can be locked onto the spindles without first angularly aligning the spindle and disk; a pneumatic piston in the base actuates the overcenter mechanism; an inlet fitting on the base cooperates with an outlet fitting on a pickup head on each arm to allow pressurized air to flow from the pickup head into the base of the locking assembly to release the overcenter mechanism and locking arms, the outlet and inlet fittings being shaped to sealingly engage when pressed against each other, whereby the locking assembly can be operated by pressing the pickup head against the locking assembly; the pickup heads include a plurality of pickup arms that can be moved inward and outward radially to engage a tapered annular flange on the disk; and a second pneumatic piston located in the pickup head moves the pickup arms and forces the outlet and inlet fittings together to pass compressed air to the locking assembly.

In another aspect of the invention a compact spinning-disk type of ion implanter is provided having an evacuated wafer chamber which slides back and forth on a sliding seal, the back cover of which carries, on its outside a rotary drive for the spinning disk, and the cover being mounted to hinge away from the chamber to expose the disk for interchange. In preferred embodiments fluid pistons move the cover between its positions and bears the weight of the chamber during implanting.

PREFERRED EMBODIMENTS

The structure and operation of preferred embodiments of the invention will now be described, after first briefly describing the drawings.

BRIEF DESCRIPTION OF THE DRAWINGS

FIG. 5 is a plan view of the disk toggle lock that holds the disks to the drive spindle.

FIG. 6 is a cross-sectional view through 6—6 of FIG. 5, showing the toggle lock in locking position of a disk and showing a pickup head for releasing the toggle lock.

FIG. 7 is a cross-sectional view similar to FIG. 6 showing the toggle lock disengaged from a disk and showing the pickup arms of the pickup head engaged with the disk.

FIG. 8 is a partial magnified view of the nose cone of the changer robot.

DETAILED DESCRIPTION

Figure 1:
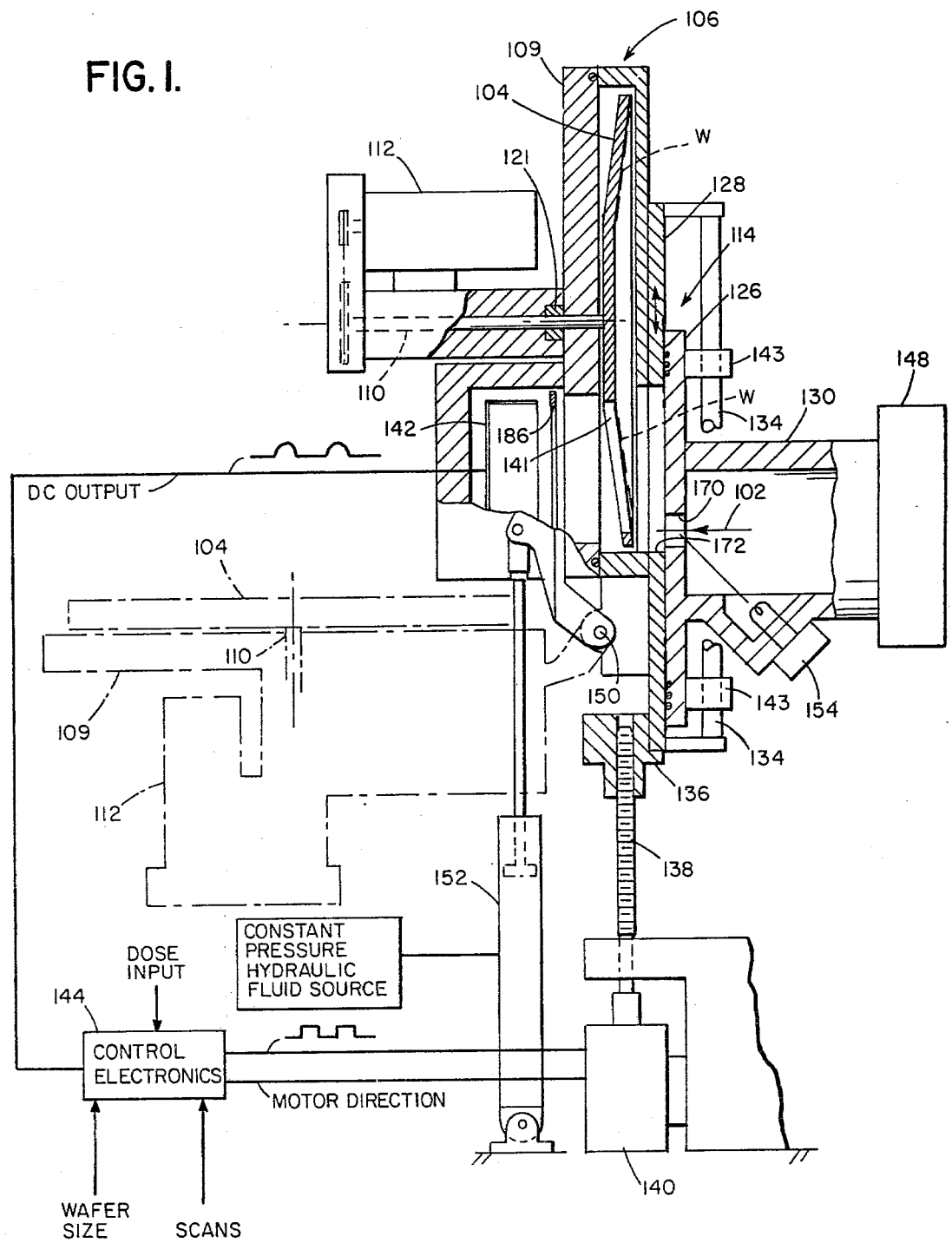
FIG. 1 is a somewhat diagrammatic, cross-sectional view of a preferred embodiment in which wafers are supported on a rotating disk in treatment position; the cover of the vacuum chamber hinges down to a first exchange position.

Referring to the figures, wafers W are mounted on the surface of a spinning disk 104, which rotates at approximately 800 rpm. The disk is contained in vacuum chamber 106, (FIG. 1), and is approximately 25 inches in diameter and ¾ inch thick. Chamber 106 is only slightly larger than the disk so as to minimize evacuated volume, the chamber being approximately 25½ inches in diameter and 1 and ½ inches thick. Eighteen three-inch-diameter wafers W are mounted on the disk in a single annular layer. Alternatively, thirteen 4" wafers could replace the eighteen smaller ones. The disk is supported on a spindle 110, which passes through the wall of the vacuum chamber 106. In order to effect a high vacuum seal around this spindle, well-known ferrofluidic seals 121 are used. The disk is driven by a DC servo-system 112, with the velocity of rotation held constant to better than 0.5%. The second axis of motion enables the entire disk chamber 106 to be moved laterally so as to move the stationary beam radially with respect to the disk. A sliding high-vacuum seal 114 permits this lateral motion. The seal consists of fixed concentric sealing rings in fixed plate 126 bearing against moving slide plate 128. The seals have a high-wear-resistance ring (high-density and high-molecular weight polyethylene) backed by an O-ring of soft-durometer buna, which provides the necessary sealing forces. Three successive seals are provided so that the individual seals do not need to undergo full atmospheric to high-vacuum differential pressure.

By use of the concentric planar seals and between-seal pumping, adequate sealing across each seal can be achieved while also using relatively low compression forces on the seal, thereby reducing frictional resistance to lateral motion and improving wear and vacuum reliability.

Chamber 106 is supported by a linear bearing system and a linear drive system, which provide the desired lateral motion of the chamber and hold the chamber away from the slide plate. The linear bearing system includes two stationary Thompson linear bearings 143 through which slide circular shafts 134, attached to the moving chamber 106. The chamber is moved laterally by stepping motor 140, which drives lead screw 138, threaded in nut 136 attached to the chamber. Beam current striking disk 104 from which electrons are suppressed by electron deflection means 186 is measured by a Faraday cage 142 positioned on the back side of the disk. A slot 141 is provided in the disk at a suitable location between the wafers from near the outer edge of the disk to the innermost radial position at which the beam strikes the disk. As the disk spins, a sample of the beam passes through the disk once every revolution, and strikes the Faraday cage 142. The samples of beam current measured during each disk revolution are fed to control electrons 144, which control motor 140. The control system moves the spinning disk through the stationary beam at a speed proportional to the detected beam current and inversely proportional to the desired ion dosage.

Disk 104 is constructed of aluminum, to provide good thermal conductivity and relatively good inertness to contamination of the semiconductor wafers. Aluminum also has a reasonably good heat capacity and it provides adequate rigidity for the high-speed rotating disk.

Cooling water inlet and outlet passages are provided within rotating shaft 110, and serve to remove heat from the hub of disk 104. Water passages can also be provided within the body of disk 104. Heat transfer from the wafer to the disk must not be impeded in order for the thermal energy created by the ion beam to be transferred to the disk thereby keeping the total temperature rise of the wafers during implantation less than about 100° C. Beam 102 is generated by a source (not shown) and passes through vacuum gate valve 148, cylinder 130, circular hole 170 in plate 126, slot 172 in slide plate 128, and into chamber 106. Electron source 154 provides a shower of electrons to neutralize the charge of the ions being deposited on the wafers.

Operation of FIG. 1

In operation of the preferred embodiment, the disk chamber is opened to exchange wafers by closing a vacuum gate valve 148 to seal off the evacuated ion beam generator, venting the chamber to atmospheric pressure, and opening the chamber.

In the embodiment of FIG. 1, the chamber cover 109, to which the disk 104, spindle 110, and drive motor 112 are attached, is rotatably supported on hinges 150. The cover is rotated 90° by cylinders 152 to the position shown in phantom lines, and a new disk with new wafers is substituted for the existing one. The cover is then restored to its normal closed position, the chamber is evacuated, and gate valve 148 is opened to connect the high-vacuum pumping system of the beam generator (not shown). At this time the rotary motion of the disk is initiated and the DC servo-system is used to bring the rotary velocity of the disk up to the fixed and constant operating velocity required for implantation. The operator selects the desired ion dosage, the wafer size, and the required number of scans, and gives a start signal to the electronics to initiate lateral motion of the chamber and disk. Once the implant is started, the entire disk chamber is moved laterally, with the disk moving through the beam the prescribed number of scans and at a velocity consistent with the measured beam intensity and the required dosage. During this scanning motion the cylinders 152 previously used to close the cover 109, now are furnished with hydraulic fluid by a constant pressure source and serve the purpose of bearing the weight of the disk-chamber assembly throughout its range of vertical travel.

Typically the scanning process may take anywhere from 1 to 60 minutes. On completion of the traversal of the disk and after it is determined that the disk has returned to initiation position with the beam located at the outer edge of the disk, the implantation is complete, and the sequence for closing the gate valve 148, venting the chamber 106, and reloading the disk spindle is initiated again.

All components have been designed to give a dosage accuracy of better than 1%. The lateral velocity has been limited so that it does not exceed maximum velocity of 1.0 inch per second. This means that the lateral distance between two successive passes of the beam will not exceed approximately 2 mm. As the beam 102 is typically on the order of 2 cm in diameter, this constraint on lateral velocity ensures excellent overlapping characteristics of the beam during the implantation process. In the described embodiment, the disk has a single sampling slot, and, as the disk is rotating at approximately 800 rpm, the period between successive beam samples is about 75 m sec. This sampling rate is sufficient to achieve an overall dosage accuracy and uniformity of better than 1%.

Disk Interchange

Figure 3:
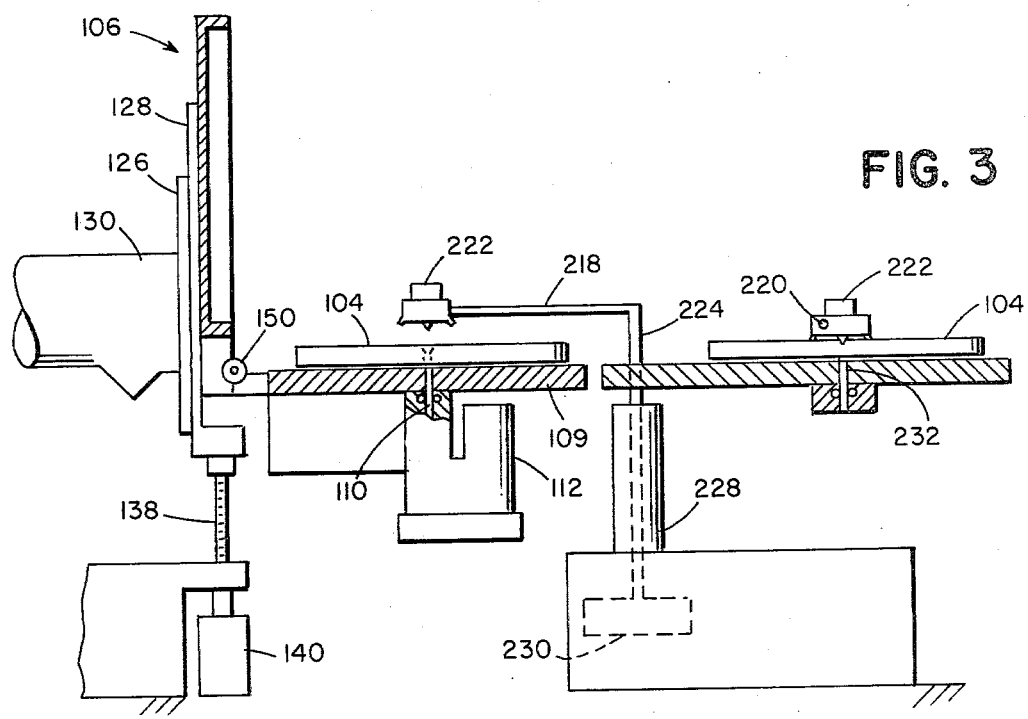
FIG. 3 is a somewhat diagrammatic, cross-sectional view at 3—3 of FIG. 2, showing a treated disk in the exchange position after being hinged downward 90° from the treatment position in the vacuum chamber.
Figure 2:
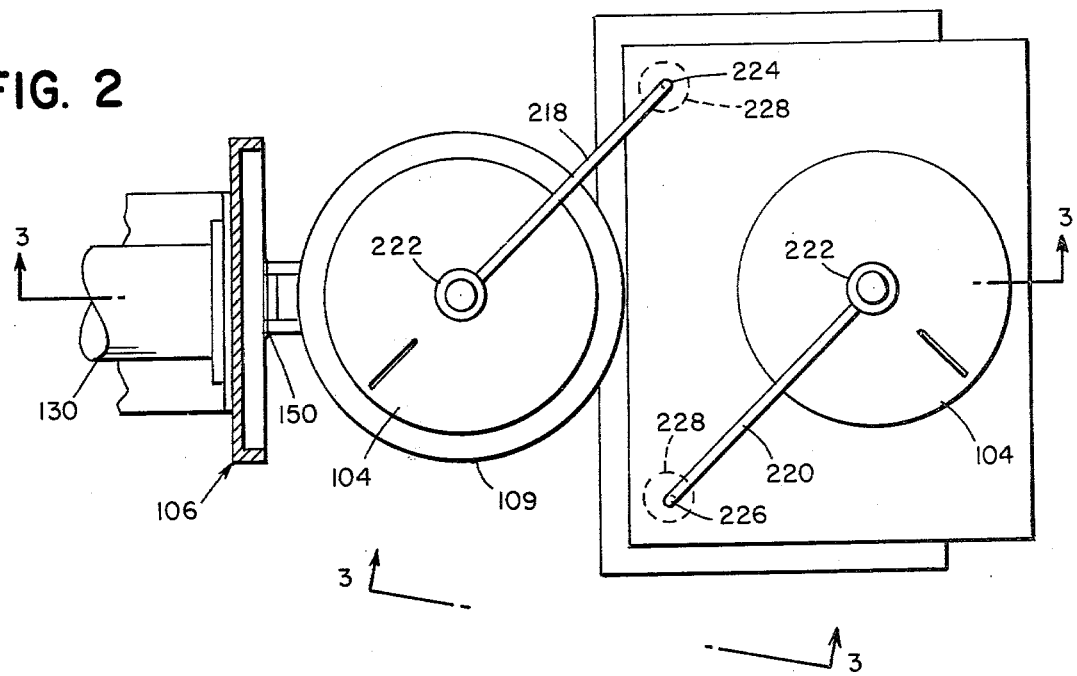
FIG. 2 is a plan view of the preferred embodiment showing both exchange positions.

Turning to FIGS. 2 and 3, there is shown apparatus for changing disks. Disk 104 is shown in a disk-transfer position rotated down 90° from its implantation position. The disk is mounted to chamber cover 109 via spindle 110 and bearings (not shown). The chamber cover is hinged at 150, and is rotated from a vertical position to the horizontal position shown by cylinders 152 (FIG. 1). Two arms 218, 220 each with a robot pickup head 222 accomplish the transfer of disks. Each arm is capable of moving vertically between a lower pickup position and an upper transfer position. To allow the two disks to pass one under the other, arm 218 moves through a vertical stroke of 6 inches whereas arm 220 moves only 1 inch. Vertical shafts 224, 226 support arms 218, 220. The shafts are each driven by a pair of conventional pneumatic cylinders. Double-ended cylinders 228 provide the vertical motion (6 inches for arm 218, 1 inch for arm 220). Rotary-action cylinders 230 (linear driven rack turning pinion attached to shaft) provide rotary motion. These cylinders are carried with the respective vertically movable shafts 224, 226, and react against stationary quide member 231 for imparting the rotary motion.

Figure 4A:
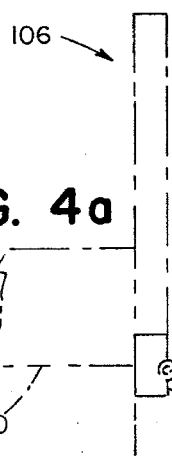
FIGS. 4a through 4g are diagrammatic views of the sequence of steps taken by the changer apparatus in reversing the positions of the two disks.
Figure 4B:
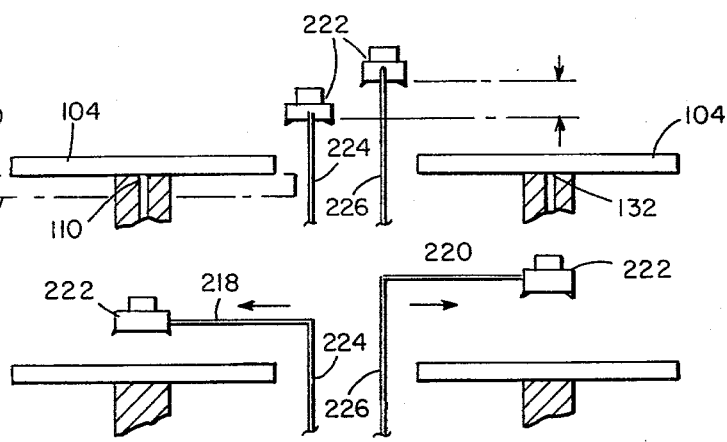
Figure 4C:
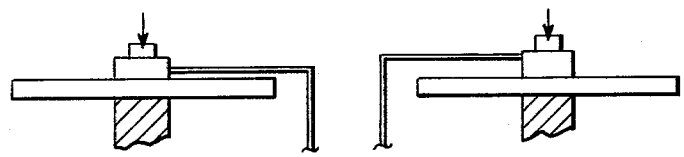
Figure 4D:
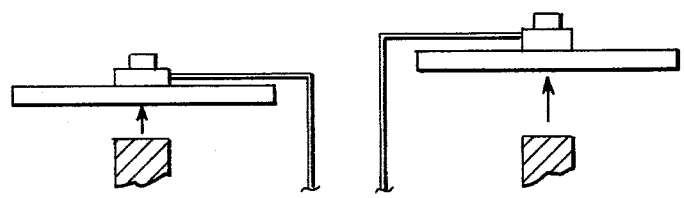
Figure 4E:
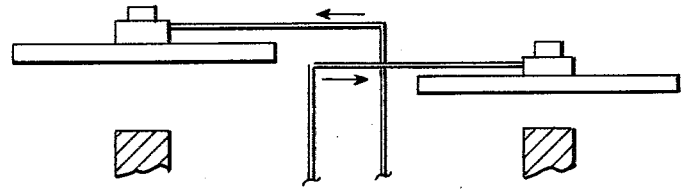
Figure 4F:
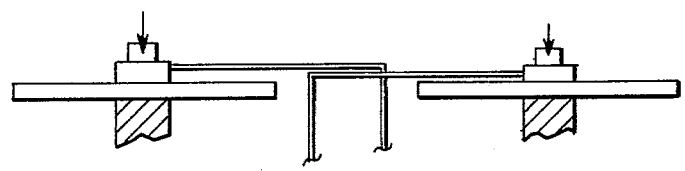
Figure 4G:
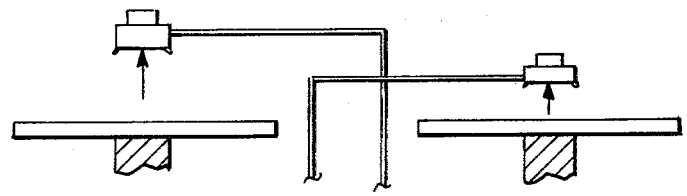

The sequence by which the two disks are interchanged is illustrated in diagrammatic form in FIGS. 4a through 4g. In FIG. 4a, the treated disk 104 is shown attached to disk spindle 110, and the new disk 104' is shown attached to transfer spindle 232. Arms 218, 220 are shown in their neutral stowage positions between the two disks. In these positions the arms are in their fully upward positions, and thus are at different heights. From this neutral position, arm 218 rotates to a position directly above treated disk 104, and arm 220 to a position above new disk 104', as shown in FIG. 4b. The next step (FIG. 4c) is for the two arms to drop vertically onto the two disks. When engaged with the disks, the two arms are at the same height. Pickup heads 222 on the ends of the arms cause toggle locks 240 (FIGS. 5-8) on the spindles 110, 232 to disengage and small pickup arms 242 on each pickup head engage the released disks. In the next step (FIG. 4d), cylinders 228 raise the arms and attached disks. Then (FIG. 4e) cylinders 230 cause the arms to rotate to interchange positions of the disks. The arms are then lowered (FIG. 4f), and pickup heads 222 release their small pickup arms 242 from each disk and cause toggle locks 240 on the spindles to engage the disks. Finally, the arms are raised (FIG. 4g), and moved back to their neutral storage position (FIG. 4a). The new disk is now attached to spindle 110, and is rotated back to the vertical position and inside vacuum chamber 106 by cylinders 152 (FIG. 1).

Turning to FIGS. 5-8, there are shown the toggle lock mechanism on each of spindles 110, 132 and the pickup head mechanism on each of arms 218, 220. Disks 104 are shown in cross section in FIGS. 6 and 7. An annular rim member 244 with locking frustroconical flange 246, is permanently attached to each disk. The disks are attached to spindle 110 by three locking arms 250, which are spaced 120° apart and press tightly against flange 246. The locking arms can engage the flange at any angular position of the disk, and thus no angular alignment of disk and spindle is required for engagement. Each arm is biased radially inward by springs (not shown), and is forced outward for locking by an overcenter toggle mechanism, consisting of a central annular member 254 and interconnected links 256, 258, 259 at each of the three 120° spaced positions of the locking arms. Outermost link 259 slides horizontally, and engages the locking arms 250. In the locked position shown in FIG. 6, annular member 254 has been pushed slightly below center into a stable, locking position.

Each toggle lock 240 is locked and unlocked by action of pickup head 222 at the end of each of arms 218, 220. When the pickup head 222 approaches a disk for pickup it has a tapered air-transmitting nose cone 260 protruding (FIG. 8) for engagement with conical nose-cone receiving surface 261 of the toggle locking mechanism. These surfaces guide the parts together into an air transmitting relation, compressing seal 263. (The nose cone has previously been moved downward by internal piston 261 in the pickup head by air supplied through port II.)

In FIG. 6, a pickup head is shown after it has just engaged a locked toggle lock. In this portion three small pickup arms 224 spaced at 120° intervals, on the pickup head are spread apart as shown in FIG. 6. (When activated, the arms will move radially inward and engage flange 248 on the rim member 244 of the disk.)

The pickup head now unlocks a disk from the toggle lock by supplying compressed air to the toggle lock via port I and the nose cone 260. This compressed air is supplied to an internal toggle lock/unlock piston 262. Piston 262 is moved upward, thereby moving annular member 254 through center and releasing the overcenter locking action on locking arms 250. The arms 250 move away from rim 244 under a spring bias. The upward motion of annular member 254 also moves upward the member 265 on which the nose cone 260 is located. This upward movement causes the small pickup arms 224 to move inward and engage flange 248 on the top side of the disk. Subsequently compressed air provided through port III is applied to the underside of piston 261, to hold the pickup arms in the engaged position. Now the pickup head can rise to lift off the disk.

This sequence of events is summarized in the following table:

TABLE

| | Ports | | | |
| --- | --- | --- | --- | --- |
| | I | II | III | Result |
| Time 1 Robot approaching | 0 | 50 psi | 0 | Nose cone protrudes and engages per FIG. 6 |
| Time 2 Nose cone has engaged | 50 psi | 0 | 0 | Toggle clamp is released and hooks 224 engage disk per FIG. 7; by piston 262 |
| Time 3 After toggle clamp is released | 0 | 0 | 50 psi | Hooks 224 now locked by piston 261 |
| Time 4 | 0 | 0 | 50 psi | Cylinder 228 is activated to lift off disk |

When the pickup head brings a new disk down on top of an unlocked toggle, no action occurs until the disk is seated. Then internal piston 261, forced downward by compressed air, causes member 265 with nose cone 260 to move downward forcing annular member 254 downward through center, thereby locking the toggle on to the disk. The same downward motion causes small pickup arms 224 to release the disk.

The disk support member 300 is provided with a heat conductive elastomeric annular layer 302 which directly engages a corresponding surface on the disk to provide an intimate heat transfer relationship. Within member 300, directly below, there is a corresponding annular cooling water passage 304. Water passages are incorporated in the shaft 110 as shown in FIG. 7. These passages introduce cold water into annular passage 304 and remove heated water from the passage, thus to take heat away from support 300 and the disk lying directly above. In this way heat generated in the wafers and on the disk by the ion beam is removed and faster doping levels are made possible.

Other embodiments are within the following claims.

What is claimed is:

1. Apparatus for exchanging a treated disk for an untreated disk in ion implantation equipment, said implantation equipment being of the type comprising a vacuum chamber in which said disks are subjected to an ion beam and a rotating spindle to which said disks are attached for rotation with respect to said beam, said exchange apparatus comprising:
   means for moving said treated disk from said vacuum chamber to a first exchange position,
   means for supporting said untreated disk at a second exchange position adjacent said first position,
   means for locking said disks to said spindle,
   means for engaging and disengaging said locking means, and
   means for simultaneously moving said treated disk from said first to said second position and said untreated disk from said second position to said first position.

2. The apparatus of claim 1 wherein said means for moving said treated disk from said vacuum chamber comprises a hinged member to which said disk and spindle are attached and a drive means for rotating said hinged member from said vacuum chamber to said first exchange position.

3. The apparatus of claim 2 wherein said hinged member forms one wall of said vacuum chamber.

4. The apparatus of claim 1 wherein said disks are horizontal in said first and second exchange positions.

5. The apparatus of claim 1 wherein said means for simultaneously moving comprises first and second pickup arms that engage the centers of said disks.

6. The apparatus of claim 5 wherein said means for simultaneously moving comprises linear actuator means for moving said arms linearly into and out of contact with said disks at said exchange positions.

7. The apparatus of claim 6 wherein said means for simultaneously moving comprises rotary actuator means for rotating said arms between said first and second exchange positions, whereby disk exchange occurs by first linearly translating said arms into engaging contact with said disks and then rotating said arms to exchange positions of said disks.

8. The apparatus of claim 7 wherein
   said linear actuator means comprises first and second actuator means, said first actuator means having a greater linear stroke than said second actuator means,
   said rotary actuator means comprises first and second rotary actuator means with pivot axes parallel to the rotational axes of said disks in said first and second exchange positions, each said pivot axis being equally spaced from said disk axes and both said pivot axes being spaced an equal distance away from a line connecting said disk axes,
   and said means for simultaneously moving said disks between exchange positions comprises means for actuating said first and second linear actuator means and said first and second rotary actuator means to transfer said disks between said positions by first linearly translating them by different linear strokes, then rotating them so that they pass one over the other until they reach the other of said exchange positions, and then linearly translating them in the opposite direction so that they come to rest at said exchange positions.

9. The apparatus of claim 8 wherein said linear translation is vertical and said disks are horizontal in said exchange positions.

10. The apparatus of claim 1 wherein said means for locking said disk to said spindle includes a base connected to said spindle and supported on said base a plurality of locking arms, an overcenter mechanism for forcing said arms outward radially, said arms each having locking surfaces for engaging a tapered annular flange surface on said disks, whereby said disks can be locked onto said spindles without first angularly aligning said spindles to said disks.

11. The apparatus of claim 2 wherein said means for engaging and disengaging said locking means comprises pneumatic piston means in said base for actuating said overcenter mechanism.

12. The apparatus of claim 11 wherein said means for engaging and disengaging further comprises
   a pneumatic conduit in said base connecting said pneumatic piston means with an inlet fitting on said base and
   an outlet fitting on said means for simultaneously moving, said outlet and inlet fittings being shaped to sealingly engage when pressed against each other,
   whereby said locking means can be operated by engaging said fittings.

13. The apparatus of claim 12 wherein said means for simultaneously moving said disks comprises pickup head means for grasping said disks.

14. The apparatus of claim 13 wherein said pickup head means comprises a plurality of pickup arms and means for moving said arms inward and outward radially, said pickup arms being spaced circumferentially around the axis of said disk when said pickup head means is in position to grasp said disk and said pickup arms each having a locking surface for engaging a second tapered annular flange surface on said disks.

15. The apparatus of claim 14 wherein said means for moving said arms inward and outward radially includes pneumatic piston means within said pickup head.

16. The apparatus of claim 15 wherein said pneumatic piston means in said pickup head is adapted to press said outlet fitting against said inlet fitting to allow compressed air to flow to said pneumatic piston in said base of said locking means.

17. A compact spinning-disk type of ion implanter having evacuated wafer chamber which slides back and forth on a sliding seal, the back cover of said chamber carrying on its outside a rotary drive for the spinning disk, and the cover being mounted to hinge away from the chamber to expose the disk for interchange.

18. The ion implanter of claim 17 including a fluid piston arranged to move said cover between implanting and exchange positions, in said implanting position said piston arranged to bear most of the weight of said wafer chamber as it is translated up and down.

19. The ion implanter of claim 17 wherein said rotary drive for the spinning disks includes a main rotating shaft supporting the disk and protruding through said back cover to an outside rotary drive motor, and water passages extending through said shaft to supply and remove cooling water from heat transfer relation to said spinning disk.

20. The ion implanter of claim 19 wherein a layer of heat conductive elastomer is intimately interposed between said disk and a rotary support surface cooled by said water to provide an effective heat conductive path therebetween.

* * * * *